(12) United States Patent
Tang et al.

(10) Patent No.: US 11,258,034 B2
(45) Date of Patent: Feb. 22, 2022

(54) DISPLAY PANEL AND PRODUCING METHOD THEREFOR, VEHICLE-MOUNTED REARVIEW MIRROR, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Guoqiang Tang, Beijing (CN); Kuo Sun, Beijing (CN); Yangpeng Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 127 days.

(21) Appl. No.: 16/754,199

(22) PCT Filed: May 24, 2019

(86) PCT No.: PCT/CN2019/088405
§ 371 (c)(1),
(2) Date: Apr. 7, 2020

(87) PCT Pub. No.: WO2019/233298
PCT Pub. Date: Dec. 12, 2019

(65) Prior Publication Data
US 2020/0280016 A1 Sep. 3, 2020

(30) Foreign Application Priority Data
Jun. 5, 2018 (CN) .......................... 201810569356.5

(51) Int. Cl.
*H01L 51/52* (2006.01)
*H01L 33/00* (2010.01)
(Continued)

(52) U.S. Cl.
CPC ...... *H01L 51/5228* (2013.01); *H01L 33/0095* (2013.01); *H01L 33/38* (2013.01); *H01L 33/405* (2013.01); *H01L 51/56* (2013.01)

(58) Field of Classification Search
CPC ....... H01L 2251/5323; H01L 2251/558; H01L 27/156; H01L 27/3246; H01L 27/3283;
(Continued)

(56) References Cited

U.S. PATENT DOCUMENTS 9,331,131 B2   5/2016  Lee et al.
10,381,381 B1* 8/2019  Choi ................ H01L 27/1248
(Continued)

FOREIGN PATENT DOCUMENTS

CN   1822738 A    8/2006
CN   103700688 A  4/2014
(Continued)

OTHER PUBLICATIONS

Office Action for corresponding Chinese Application 201810569356.5 dated Aug. 15, 2019.
(Continued)

*Primary Examiner* — Jaehwan Oh
(74) *Attorney, Agent, or Firm* — Arent Fox LLP; Michael Fainberg

(57) ABSTRACT

A display panel and a producing method therefor, a vehicle-mounted rearview mirror, and a display device. The display panel comprises: a base substrate; a pixel defining layer, located at one side of the base substrate, the pixel defining layer comprising a plurality of openings distributed in an array; a cathode layer, located at the side of the pixel defining layer opposite to the base substrate; and an auxiliary cathode layer, located at the side of the cathode layer opposite to the pixel defining layer, the auxiliary cathode layer being directly in contact with and electrically con-
(Continued)

nected to the cathode layer. The auxiliary cathode layer has a first thickness at positions corresponding to the plurality of the openings, and a second thickness at positions other than the openings; the first thickness is less than the second thickness.

17 Claims, 6 Drawing Sheets

(51) Int. Cl.
*H01L 33/38* (2010.01)
*H01L 33/40* (2010.01)
*H01L 51/56* (2006.01)

(58) Field of Classification Search
CPC ... H01L 33/38; H01L 33/405; H01L 51/5228; H01L 51/56
See application file for complete search history.

(56) References Cited

U.S. PATENT DOCUMENTS

| | | | |
|---|---|---|---|
| 11,016,624 B2* | 5/2021 | Wang | H01L 27/3251 |
| 2006/0158095 A1 | 7/2006 | Imamura | |
| 2011/0303930 A1 | 12/2011 | Bang et al. | |
| 2012/0268000 A1* | 10/2012 | Choi | H01L 51/5234 |
| | | | 313/504 |
| 2015/0243716 A1* | 8/2015 | Kwon | H01L 51/5221 |
| | | | 257/40 |
| 2015/0331161 A1 | 11/2015 | Wang et al. | |
| 2016/0149156 A1 | 5/2016 | Kim et al. | |
| 2017/0294493 A1 | 10/2017 | Yoo et al. | |
| 2018/0138441 A1 | 5/2018 | Choung et al. | |
| 2020/0280016 A1 | 9/2020 | Tang et al. | |

FOREIGN PATENT DOCUMENTS

| | | |
|---|---|---|
| CN | 103956376 A | 7/2014 |
| CN | 104362169 A | 2/2015 |
| CN | 104576705 A | 4/2015 |
| CN | 104867955 A | 8/2015 |
| CN | 105514144 A | 4/2016 |
| CN | 105633297 A | 6/2016 |
| CN | 106992204 A | 7/2017 |
| CN | 206401365 A | 8/2017 |
| CN | 107331785 A | 11/2017 |
| CN | 108074954 A | 5/2018 |
| CN | 108767136 A | 11/2018 |
| KR | 100778443 B1 | 11/2007 |

OTHER PUBLICATIONS

Office Action for corresponding Chinese Application 201810569356.5 dated Feb. 25, 2020.

* cited by examiner

0
DISPLAY PANEL AND PRODUCING METHOD THEREFOR, VEHICLE-MOUNTED REARVIEW MIRROR, AND DISPLAY DEVICE

The present application is a national stage application of International Application No. PCT/CN2019/088405, filed May 24, 2019, which claims priority to Chinese Patent Application No. 201810569356.5, filed with the Chinese Patent Office on Jun. 5, 2018 and titled "Mirror Plane Display Screen and Preparing Method Therefor", both of which are hereby incorporated by reference in their entireties.

FIELD

The present disclosure relates to the technical field of display devices, and in particular to a display panel and a preparing method therefor, a vehicle-mounted rearview mirror, and a display device.

BACKGROUND

In the related art, a rearview mirror in a car generally includes two areas, one area is a reflective mirror and the other area is a display screen for displaying some information. For example, the display screen can display navigation information. When an image is displayed on the display screen, since the light reflected by the reflective mirror is relatively high, it is difficult for a driver to clearly see the content displayed on the display screen. Besides, since the light emergent during the image displaying on the display screen is relatively high, it is also difficult for the driver to clearly see the image reflected by the reflective mirror. Therefore, the rearview mirror in the related art cannot simultaneously achieve the display function and the reflection function.

SUMMARY

A display panel provided by the embodiment of the present disclosure includes:

a base substrate;

a pixel defining layer, disposed on one side of the base substrate, wherein the pixel defining layer includes a plurality of openings distributed in an array;

a cathode layer, disposed on one side of the pixel defining layer away from the base substrate; and an auxiliary cathode layer, disposed on one side of the cathode layer away from the pixel defining layer, wherein the auxiliary cathode layer is directly in contact with and electrically connected to the cathode layer, and the auxiliary cathode layer has a first thickness at positions corresponding to the plurality of openings, and a second thickness at positions other than the plurality of openings;

and the first thickness is less than the second thickness, the display panel is configured to display an image at the positions corresponding to the plurality of openings and reflect an image at the positions other than the plurality of openings.

Optionally, in the embodiment of the present disclosure, the display panel further includes:

a plurality of filling structures located between the auxiliary cathode layer and the cathode layer and corresponding to the openings, wherein the cathode layer is a reflective electrode, the first thickness of the auxiliary cathode layer is greater than 0, the auxiliary cathode layer has, at one side facing the cathode layer, a plurality of grooves corresponding to the respective openings; and at least part of the filling structures are embedded in corresponding grooves.

Optionally, in the embodiment of the present disclosure, along a direction in which the base substrate is directed to the cathode layer, a cross-sectional area of the groove, in a direction parallel to the base substrate, gradually decreases.

Optionally, in the embodiment of the present disclosure, the auxiliary cathode layer has, on one side away from the cathode layer, a plurality of protrusions at positions corresponding to the openings.

Optionally, in the embodiment of the present disclosure, the display panel further includes:

a plurality of anodes located between the pixel defining layer and the base substrate;

wherein the anode includes a reflective electrode; and the first thickness of the auxiliary cathode layer is equal to 0.

Optionally, in the embodiment of the present disclosure, the anode includes:

two transparent electrodes disposed in a laminating manner, and the reflective electrode located between the two transparent electrodes.

Optionally, in the embodiment of the present disclosure, the display panel further includes:

a buffer layer disposed between the base substrate and the anodes, wherein the buffer layer has, at one side facing the pixel defining layer, a plurality of recesses, wherein positions of the plurality of recesses correspond to positions of respective openings;

positions of the plurality of anodes correspond to the positions of the respective recesses, and at least part of the anodes are embedded in corresponding recesses; and along a direction in which the base substrate is directed to the cathode layer, a cross-sectional area of the recess, in the direction parallel to the base substrate, gradually increases.

Optionally, in the embodiment of the present disclosure, a material of the transparent electrode is indium tin oxide, and a material of the reflective layer is silver.

Optionally, in the embodiment of the present disclosure, the cathode layer is embedded in the openings at the positions corresponding to the openings.

Optionally, in the embodiment of the present disclosure, the display panel further includes:

a light-emitting layer disposed between the cathode layer and the base substrate, wherein the light-emitting layer includes a plurality of light-emitting units corresponding to the respective openings; and a surface of one side of each light-emitting unit away from the base substrate is closer to the base substrate than a surface of one side of the pixel defining layer away from the base substrate.

Optionally, in the embodiment of the present disclosure, a material of the cathode layer is a magnesium-silver alloy.

Optionally, in the embodiment of the present disclosure, a material of the auxiliary cathode layer is silver or aluminum.

Correspondingly, the embodiment of the present disclosure also provides a display device, including the above display panel.

Correspondingly, the embodiment of the present disclosure also provides a vehicle-mounted rearview mirror, including the above display panel.

Correspondingly, the embodiment of the present disclosure also provides a method for preparing the above display panel, including:

forming a pixel defining layer on a base substrate;

patterning the pixel defining layer to form a plurality of openings distributed in an array;

forming a cathode layer on one side of the pixel defining layer away from the base substrate; and forming an auxiliary cathode layer on one side of the cathode layer away from the pixel defining layer, wherein: the auxiliary cathode layer has a first thickness at positions corresponding to the plurality of openings, and a second thickness at positions other than the plurality of openings; and the first thickness is less than the second thickness.

Optionally, in the embodiment of the present disclosure, a display surface of the display panel is arranged on one side of the base substrate away from the pixel defining layer; and forming an auxiliary cathode layer on one side of the cathode layer away from the pixel defining layer includes:

thinning the auxiliary cathode layer at the positions corresponding to the openings by adopting an etching process.

Optionally, in the embodiment of the present disclosure, a display surface of the display panel is arranged on one side of the base substrate facing the pixel defining layer; and forming the auxiliary cathode layer on one side of the cathode layer away from the pixel defining layer includes:

adopting a mask to cover areas corresponding to the openings, evaporating the auxiliary cathode layer at one side of the cathode layer away from the pixel defining layer, and removing the mask after the evaporating.

DETAILED DESCRIPTION OF THE EMBODIMENTS

The technical solutions in the embodiments of the present disclosure will be clearly and completely described below with reference to the accompanying drawings in the embodiments of the present disclosure. Obviously, the described embodiments are only part but not all of the embodiments of the present disclosure. Based on the embodiments in the present disclosure, all other embodiments obtained by those ordinarily skilled in the art without making creative efforts fall within the protection scope of the present disclosure.

Figure 1:
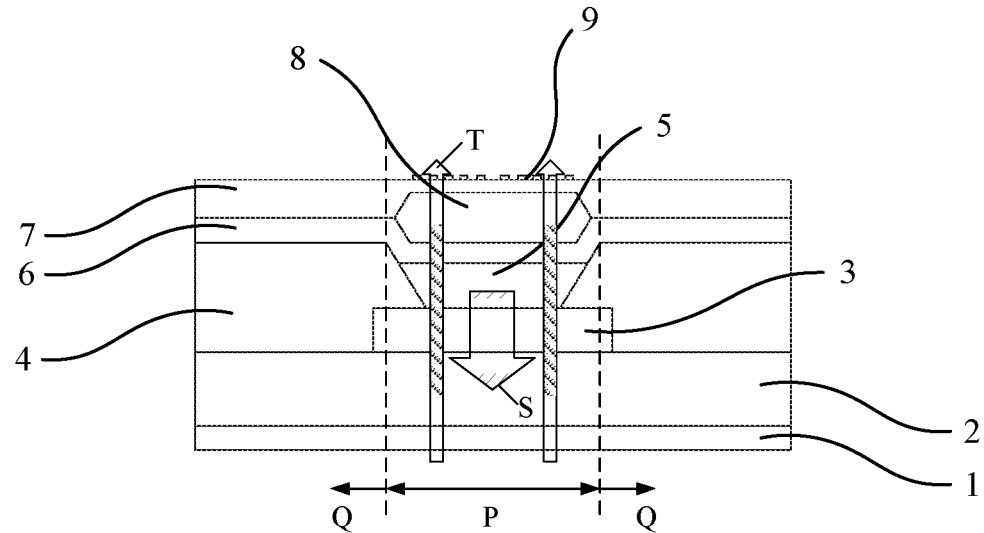
FIG. 1 is a first structural schematic diagram of the display panel provided in an embodiment of the present disclosure.

The present disclosure provides a display panel, as shown in FIG. 1, including:

a base substrate 1;

a pixel defining layer 4, disposed on one side of the base substrate 1, wherein the pixel defining layer includes a plurality of openings distributed in an array;

a cathode layer 6, disposed on one side of the pixel defining layer 4 away from the base substrate 1; and an auxiliary cathode layer 7, disposed on one side of the cathode layer 6 away from the pixel defining layer 4, wherein the auxiliary cathode layer 7 is directly in contact with and electrically connected to the cathode layer 6, and the auxiliary cathode layer 6 has a first thickness at positions corresponding to the plurality of openings, and a second thickness at positions other than the plurality of openings;

the first thickness is less than the second thickness, and the display panel is configured to display an image at the positions corresponding to the plurality of openings and reflect the image at the positions other than the plurality of openings.

As shown in FIG. 1, a bottom emission-type display panel is taken as an example. In the embodiment of the present disclosure, the thickness of the auxiliary cathode layer 7 corresponding to the opening position is smaller, so that the light transmittance of the display panel at the opening position (that is, an opening area P in the drawing) is better. Most of the ambient light can pass through the opening position of the display panel (shown as an arrow T in the drawing), so that the reflected light of the display panel at the opening position is weaker. Therefore, the light emergent from the display image of the display panel (shown as an arrow S in the drawing) is relatively high, and a viewer can see the display image of the display panel more clearly. In addition, the display panel at least has a double-layer electrode layer including the cathode layer and the auxiliary cathode layer in the area other than openings (that is, a non-opening area Q in the drawing). The thickness of the double-layer electrode layer is larger and the reflectivity is relatively high, so that the display panel has the relatively high reflectivity at the positions other than the openings. Hence, the contrast of mirror plane display is improved, and the viewer can clearly see the image reflected by the display panel so that the function of displaying the image and the function of reflecting the image can be realized at the same time.

Figure 2:
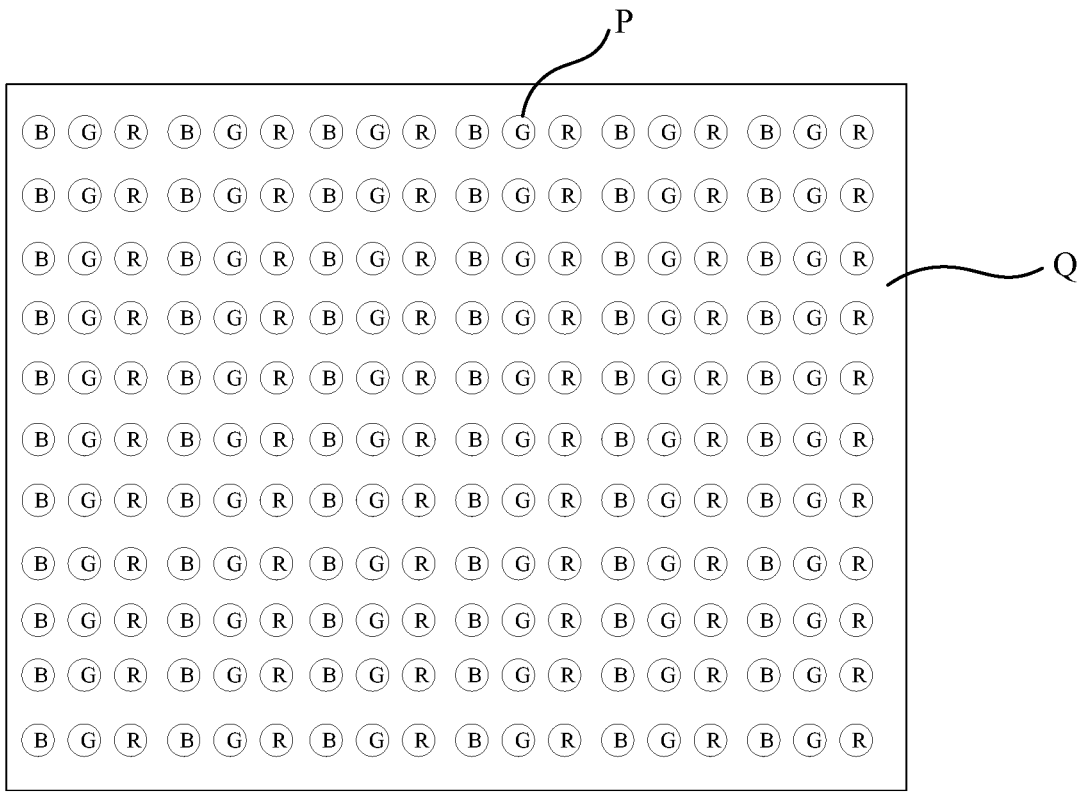
FIG. 2 is a structural schematic diagram of a top view of the display panel provided in an embodiment of the present disclosure.

FIG. 2 is a structural schematic diagram of a top view of the display panel provided in the embodiment of the present disclosure. Circles in the drawing indicate the opening areas P of the display panel. Since the opening areas P have light-emitting layers of different colors, the display panel can emit different colors at each opening area P to display the corresponding image. The area other than the opening areas P in the drawing is the non-opening area Q. Since the non-opening area Q has the relatively high reflectivity, the viewer can view the image reflected by the display panel at the non-opening area Q to achieve mirror plane display.

Figure 3:
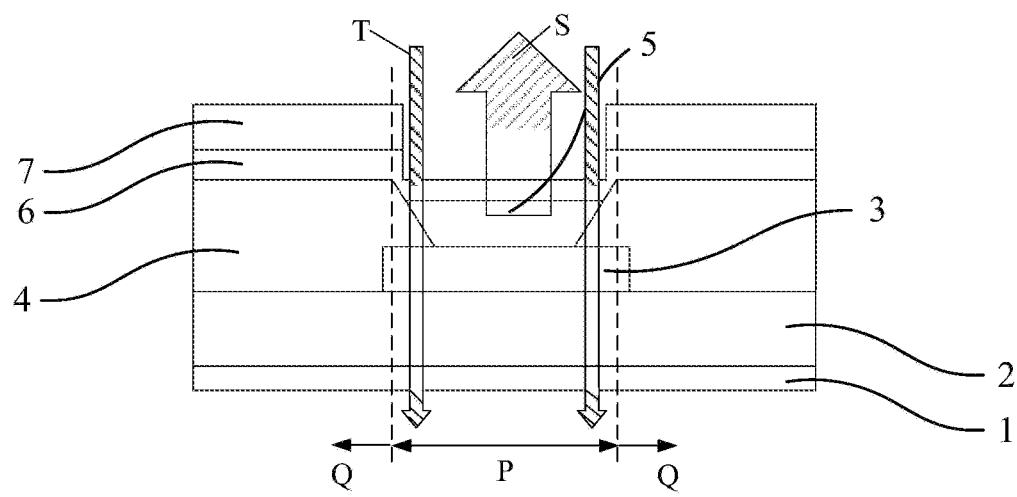
FIG. 3 is a second structural schematic diagram of the display panel provided in an embodiment of the present disclosure.

The display panel provided by the embodiment of the present disclosure may be a bottom emission type as shown in FIG. 1 or a top emission type as shown in FIG. 3. That is, the display panel shown in FIG. 3 uses one surface of the auxiliary cathode layer 7 away from the base substrate 1 as a display surface. Optionally, the light S emergent from the light-emitting layer 5 is emergent toward one side away from the base substrate 1 to display the image. The top emission-type display panel shown in FIG. 3 can also realize a display function and a reflection function at the same time, and the display principle thereof is similar to that of the bottom emission-type display panel shown in FIG. 1, and is not repeated here.

In some implementations, as shown in FIG. 1 and FIG. 3, the display panel provided by the embodiment of the present disclosure may further include: a buffer layer 2 disposed on one side of the base substrate 1; an anode 3 located between the buffer layer 2 and the pixel defining layer 4 and a light-emitting layer 5 located between the anode 3 and the cathode layer 6. The surface of the light-emitting layer 5 away from the anode 3 is lower than the surface of the part outside the opening area of one side of the pixel defining layer 4 away from the buffer layer 2. The auxiliary cathode layer 7 and the cathode layer 6 are in direct contact and are electrically connected so that the sheet resistance of the cathode layer 6 can be reduced, the voltage drop between the intermediate position and the edge position of the display panel can be reduced, the brightness uniformity of the display panel can be improved, and the overall power consumption of the display panel can be reduced. In addition, the cathode layer 6 can be made relatively thin to increase the transmittance at the opening area.

As shown in FIG. 1, for the bottom emission-type display panel, the display panel may further include: a plurality of filling structures 8 located between the auxiliary cathode layer 7 and the cathode layer 6 and corresponding to the openings;

The cathode layer 6 is a reflective electrode, and the first thickness of the auxiliary cathode layer 7 is greater than 0. The auxiliary cathode layer 7 has a plurality of grooves corresponding to the openings respectively on one side facing the cathode layer 6.

At least part of the filling structures 8 are embedded in the corresponding grooves.

In some implementations, the cathode layer 6 is disposed as a reflective electrode, for example, a reflective layer is coated on one side of the cathode layer 6 away from the base substrate 1, so that the light emitted by the light-emitting layer 5 is emergent from one side of the base substrate 1, and bottom emission-type display is realized. In order to enable the ambient light to penetrate through the opening area, the reflective layer may have a certain light transmittance. By disposing the filling structure 8 between the auxiliary cathode layer 7 and the cathode layer 6 in each opening area P, in some processes, after the auxiliary cathode layer 7 is formed on the filling structure 8, the filling structure 8 can underlay the auxiliary cathode layer 7 at the opening area P so as form the groove at the auxiliary cathode layer 7. At least a part of the filling structure 8 is embedded in the groove. Due to the existence of the filling structure 8, the surface of one side of the auxiliary cathode layer 7 away from the base substrate 1 is protruded at the opening area P. In some processes, the protrusion of the auxiliary cathode layer 7 at the opening area P can be etched away by an etching process to achieve the thinning and planarization of the auxiliary cathode layer 7 at the opening area P.

Further, in the above display panel provided by the embodiment of the present disclosure, referring to FIG. 1 as well, along the direction in which the base substrate 1 is directed to the cathode layer 6 (that is, the direction from the bottom to the top in the FIG. 1), the cross-sectional area of the grooves in the direction parallel to the base substrate 1 gradually decreases (that is, the cross-sectional view of the groove shown in FIG. 1 is trapezoid).

The auxiliary cathode layer 7 forms a reflective cup structure at the groove. The auxiliary cathode layer 7 is a reflective surface of the reflective cup structure. The side surfaces of the groove can collect part of the light lost by a waveguide after the light emitted by the light-emitting layer is irradiated to the auxiliary cathode layer 7, thereby increasing the utilization ratio of the light emitted from the light-emitting layer, and improving the display contrast. The external ambient light incident into the display panel from one side of the base substrate 1 can still penetrate directly through the opening area P. Besides, the non-opening area Q at least has the double-layer electrode including the cathode layer 6 and the auxiliary cathode layer 7. The thickness at the position of the double-layer electrode is larger, and the reflectivity is strong. The ambient light emitted to the non-opening area Q can be reflected, thereby ensuring the contrast of mirror plane display.

In some implementations, in the above display panel provided by the embodiment of the present disclosure, the auxiliary cathode layer 7 has a plurality of protrusions 9 at positions corresponding to the openings on one side away from the cathode layer 6.

In some processes, an etching thinning process or other processes may be used to form the plurality of protrusions 9 at the positions of the auxiliary cathode layer 7 corresponding to the opening areas P, so that the surface of one side of the auxiliary cathode layer 7 away from the base substrate 1 is rough. The reflection of the external ambient light is reduced, the external ambient light is enabled to be diverged when penetrating through the auxiliary cathode layer 7, and the external ambient light can be prevented from being too concentrated after penetrating through the auxiliary cathode layer.

As shown in FIG. 3, for the top emission-type display panel, the above display panel provided by the embodiment of the present disclosure may further include: a plurality of anodes 3 located between the pixel defining layer 6 and the base substrate 1.

The anodes 3 include reflective electrodes. The first thickness of the auxiliary cathode layer 7 is equal to 0.

In some implementations, the anodes 3 are disposed as reflective electrodes, for example, a reflective layer is coated on one side of each anode 3 close to the base substrate 1, so that the light emitted by the light-emitting layer 5 is emitted from one side away from the base substrate 1, and top emission-type display is realized. In order to allow the ambient light to penetrate through the opening area, the reflective layer may have a certain light transmittance. In addition, by removing the pattern of the auxiliary cathode layer 7 at the opening area P, the light transmittance of the display panel at the opening area P can be increased, and the display contrast can be improved.

In the display process, the light emitted from the light-emitting layer 5 is emergent from one side of the auxiliary cathode layer 7 away from the base substrate 1 to realize image display. For the external ambient light emitted to the display panel from one side of the auxiliary cathode layer 7, one part of the external ambient light passes through the display panel at the opening area P and is emitted from the other side, and the other part of the external ambient light is emitted toward the double-layer electrode layer composed of the auxiliary cathode layer 7 and the cathode layer 6 to be reflected, thereby realizing mirror plane display and improving the contrast of mirror plane display.

In some processes, a mask can be used to block the position of each opening area P, and the auxiliary cathode layer can be formed at the non-opening area Q by evaporation, or the auxiliary cathode layer 7 at the corresponding position of the opening area P can also be removed by an etching process, but the surface of the cathode layer 6 should be not damaged as much as possible.

Optionally, in the display panel provided by the embodiment of the present disclosure, the anode may include: two transparent electrodes disposed in a laminating manner, and the reflective electrode located between the two transparent electrodes. A material of the transparent electrodes may be a transparent conductive material such as indium tin oxide (ITO), and a material of the reflective electrodes may be a metal material such as silver (Ag).

Figure 4:
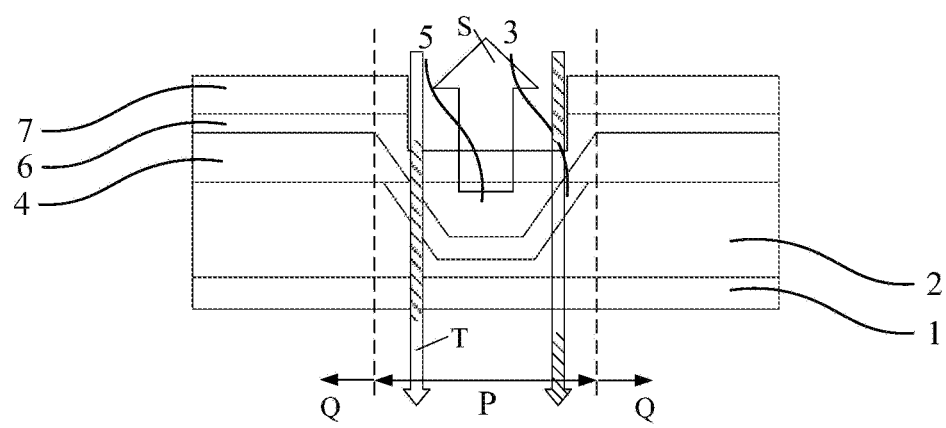
FIG. 4 is a third structural schematic diagram of the display panel provided in an embodiment of the present disclosure.

As shown in FIG. 4, the display panel provided in the embodiment of the present disclosure may further include: a buffer layer 2 located between the base substrate 1 and the anodes 3.

The buffer layer 2 has a plurality of recesses on one side facing the pixel defining layer 4, and the positions of the plurality of recesses correspond to the positions of the openings one to one. The positions of the plurality of anodes 3 correspond to the positions of the recesses one to one, and at least part of the anodes 3 are embedded in the corresponding recesses.

In the direction in which the base substrate 1 is directed to the cathode layer 6 (that is, the direction directed from the bottom to the top in the FIG. 4), a cross-sectional area of the recesses in the direction parallel to the base substrate gradually increases.

A plurality of recesses are disposed on one side of the buffer layer 2 facing the pixel defining layer 4, and along the direction in which the base substrate 1 is directed to the cathode layer 6, a cross-sectional area of the recesses in the direction parallel to the base substrate 1 gradually increases. As shown in the FIG. 4, the cross section of the recesses is an inverted trapezoid. At least part of the anodes 3 are embedded in the corresponding recesses. The anode 3 has a reflective layer on one side close to the base substrate 1, so that the part of the anode 3 embedded in the recesses form the reflective cup structure. Through the side surface of the reflective cup structure, the waveguide loss light of the light-emitting layer 5 incident on the anodes 3 can be reflected to be emergent from the opening area P, thereby facilitating the collection of part of the light lost by the waveguide after the irradiation to the anodes 3, increasing the light utilization ratio of the display panel and further improving the display contrast. In some processes, the plurality of recesses can be etched on the surface of one side of the buffer layer 2 away from the base substrate 1, and a pattern of the anode 3 is formed in the recess to form the reflective cup structure.

In addition, the external ambient light incident into the display panel from one side of the auxiliary cathode layer 7 can still penetrate directly through the opening area P, and the non-opening area Q at least has the double-layer electrode including the cathode layer 6 and the auxiliary cathode layer 7. The thickness of the reflective layer at the position of the double-layer electrode is larger, and the reflectivity is strong. The ambient light emitted to the non-opening area Q can be reflected, thereby ensuring the contrast of mirror plane display.

In some implementations, in the above display panel provided in the present embodiment, as shown in FIGS. 1 and 3, the cathode layer 6 is embedded in the openings at a position corresponding to the openings.

Optionally, the display panel provided in the embodiment of the present disclosure further includes: a light-emitting layer 5 disposed between the cathode layer 6 and the base substrate 1.

The light-emitting layer 5 includes a plurality of light-emitting units corresponding to the openings one to one.

The surface of one side of each light-emitting unit away from the base substrate 1 is closer to the base substrate 1 than the surface of one side of the pixel defining layer 4 away from the base substrate 1.

Optionally, in the display panel provided by the embodiment of the present disclosure, the material of the anodes 3 may be conductive glass or silver. The material of the cathode layer 6 may be a magnesium-silver alloy. The material of the auxiliary cathode layer 7 may be silver or aluminum.

Based on the same inventive concept, the embodiment of the present disclosure further provides a display device including any one of the above display panels provided by the embodiment of the present disclosure. Since the principle of the display device for solving the problem is similar to that of the above display panel, the implementation of the display device can refer to the embodiment of the above display panel, and the details will not be repeated.

Based on the same inventive concept, the embodiment of the present disclosure further provides a vehicle-mounted rearview mirror, which includes any one of the above display panels provided by the embodiment of the present disclosure. Since the principle of the vehicle-mounted rearview mirror for solving the problem is similar to that of the above display panel, the implementation of the vehicle-mounted rearview mirror can refer to the embodiment of the above display panel, and the details will not be repeated.

In some implementations, the above display panel is applied to the vehicle-mounted rearview mirror, the auxiliary cathode layer is thinner at the opening area, and the ambient light emitted towards the opening area can penetrate through the opening area, so that the display brightness of the opening area is higher, the display contrast is improved, and a driver is enabled to see the image displayed on the display panel. In addition, the auxiliary cathode layer at the non-opening area is thicker, and the reflection effect obtained by the double-layer electrode formed by laminating the auxiliary cathode layer and the cathode layer is better, so that when the ambient light is irradiated to the non-opening area other than the opening area, the driver can also clearly see the image behind a car reflected by the vehicle-mounted mirror, and the driver can simultaneously view the display image and the mirror-plane-reflected image.

Based on the same inventive concept, the present disclosure further provides a method for preparing any one of the display panels provided in the above technical solution. Since the principle of the preparing method for solving the problem is similar to that of the above display panel, the implementation of the preparing method can refer to the embodiment of the above display panel, and the details will not be repeated.

Figure 5:
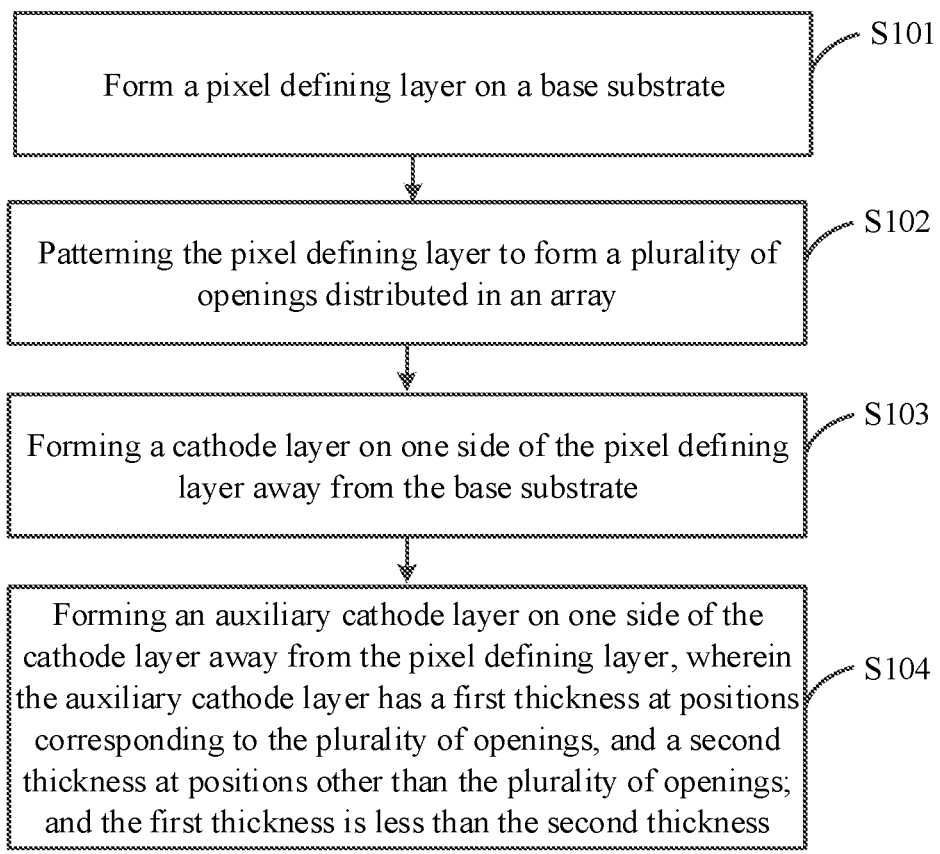
FIG. 5 is a flowchart of a method for preparing the above display panel provided in an embodiment of the present disclosure.

Optionally, as shown in FIG. 5, the method for preparing the above display panel provided by the embodiment of the present disclosure includes:

S101: forming a pixel defining layer on a base substrate;

S102: patterning the pixel defining layer to form a plurality of openings distributed in an array;

S103: forming a cathode layer on one side of the pixel defining layer away from the base substrate; and S104: forming an auxiliary cathode layer on one side of the cathode layer away from the pixel defining layer, wherein the auxiliary cathode layer has a first thickness at positions corresponding to the plurality of openings, and a second thickness at positions other than the plurality of openings; and the first thickness is less than the second thickness.

In the method for preparing the display panel provided by the embodiment of the present disclosure, the thickness of the auxiliary cathode layer formed at the position corresponding to the openings is thinner, so that the light transmittance of the display panel at the opening position is better. Most of the ambient light can penetrate through the opening position of the display panel, so that the light emergent from the display image of the display panel is relatively high, and a viewer can see the display image of the display panel more clearly. In addition, the display panel at least has the double-layer electrode layer including the cathode layer and the auxiliary cathode layer in the area other than the plurality of openings. The thickness of the double-layer electrode layer is larger and the reflectivity is high, so that the contrast of mirror plane display is improved, and the viewer can clearly see the image reflected by the display panel. Therefore, the function of displaying the image and the function of reflecting the image can be realized at the same time.

Hereinafter, the preparing processes of the bottom emission-type and top emission-type display panels will be described in detail respectively with reference to the drawings.

Figure 6:
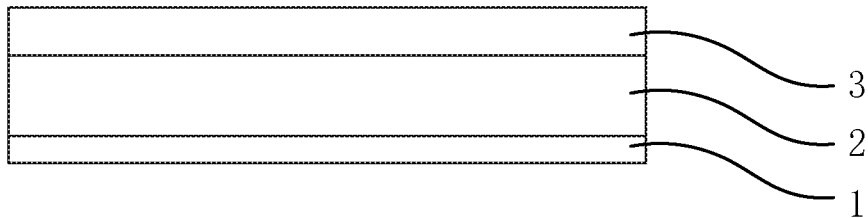
FIGS. 6 to 10 are structural schematic diagrams corresponding to respective steps in a method for preparing a bottom emission-type display panel.
Figure 7:
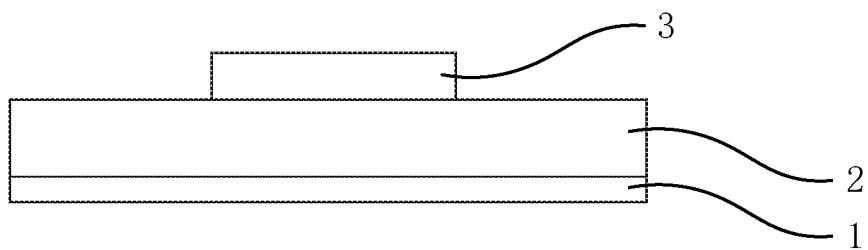

For the bottom emission-type display panel, that is, the display surface of the display panel is one side of the base substrate deviated from the pixel defining layer, before the above step S101, the method may further include: as shown in FIG. 6, forming a buffer layer 2 and anodes 3 sequentially on the base substrate 1, and then, as shown in FIG. 7, patterning the anodes 3 by, for example, an etching process.

Figure 8:
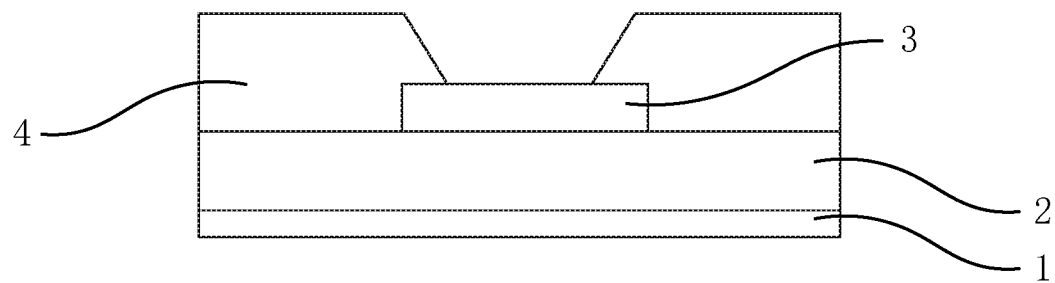

As shown in FIG. 8, in the above step S101, the pixel defining layer 4 is formed on the film layer where the anodes 3 are located. In step S102, the pixel defining layer 4 is patterned by, for example, an etching process, to form a plurality of openings arranged in an array, and each opening corresponds to one anode 3.

Figure 9:
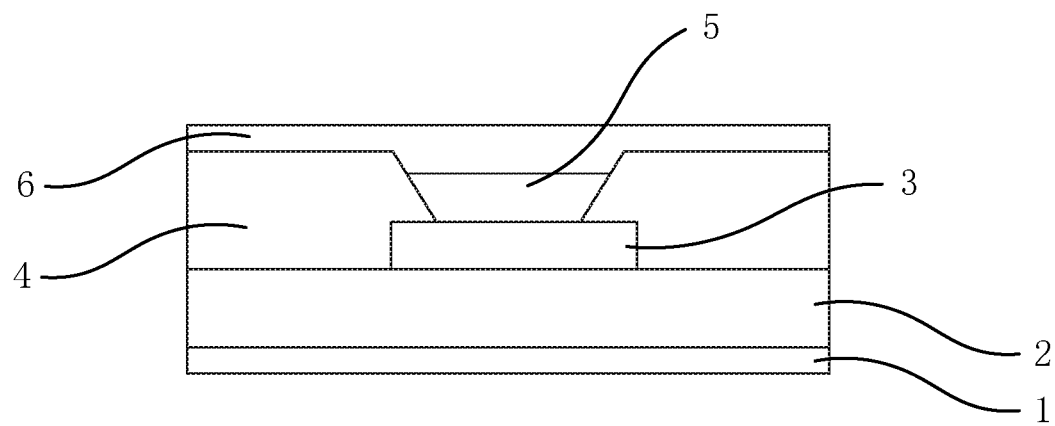

As shown in FIG. 9, before the above step S103, a light-emitting layer 5 is formed in each opening of the pixel defining layer 4. In the above step S103, a cathode layer 6 is formed on the film layer where the light-emitting layer 5 is located, and the cathode layer 6 is disposed in the form of a whole surface. In order to achieve bottom emission display, a reflective layer may be formed on one side of the cathode layer 6 away from the base substrate 1. In order to enable ambient light to penetrate through the opening area, the reflective layer should have a certain light transmittance.

Figure 10:
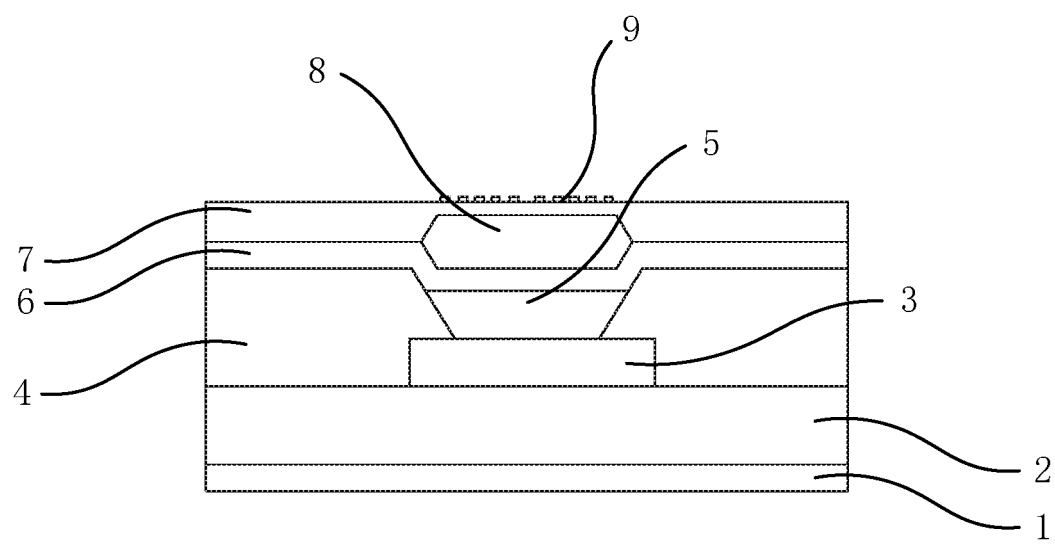

As shown in FIG. 10, a filling structure 8 is formed at a position corresponding to the opening area. Optionally, a filling layer may be formed on the cathode layer 6, and then the etching process is used to remove the filling layer at the non-opening area to form each filling structure 8. The auxiliary cathode layer 7 is formed on the film layer where the filling structure 8 is located. Due to the existence of the filling structure 8, there will be protrusions formed on the auxiliary cathode layer 7 at the opening area. In the above step S104, the etching process is used to thin the auxiliary cathode layer 7 corresponding to the opening positions. Meanwhile, the protrusions of the auxiliary cathode layer 7 at the opening area are removed to play a role of planarization. By controlling the parameters of the etching process in step S104 or using other separate processes, the surface of the auxiliary cathode layer 7 at the opening area is roughened to reduce light reflection.

According to the bottom-emission display panel, for the external ambient light emitted from one side of the base substrate 1 toward the display panel, one part of the external ambient light directly penetrates through and is emergent from the opening area, and the other part of the external ambient light is reflected in the non-opening area. At the non-opening area, the double-layer electrode including the cathode 6 and the un-etched auxiliary cathode layer 7 has the larger thickness, so the reflectivity is high, and the contrast of mirror plane display can be improved. In addition, the auxiliary cathode layer 7 and the filling structure 8 form a reflective cup structure, and part of the light lost by the waveguide of the light-emitting layer can be collected, so that the utilization ratio of the light emitted by the light-emitting layer is increased, and further the light intensity of the display panel for displaying the image is enhanced.

For the bottom emission-type display panel, that is, the display surface of the display panel is one side of the base substrate facing the pixel defining layer. The above step S104 may include: using a mask to block the areas corresponding to the openings, evaporating the auxiliary cathode layer on one side of the cathode layer away from the pixel defining layer, and removing the mask after the evaporation is completed. During the process, by accurately aligning the mask and the opening areas, the auxiliary cathode layer will not be evaporated at the opening areas for protecting the opening areas, and it can be ensured that the cathode layer at the opening areas will not be damaged. Or the etching process can also be adopted to form the pattern of the auxiliary cathode layer, and via holes penetrating through the auxiliary cathode layer 7 are formed at the opening areas. It is necessary to ensure that the cathode layer is not damaged, or the possible damage is minimized as much as possible.

Optionally, for the top emission-type display panel shown in FIG. 3, the process steps before forming the cathode layer are similar to those of the above bottom emission-type display panel, except that the reflective layer having a certain light transmittance is formed at one side of the anode 3 close to the base substrate 1, instead of forming the reflective layer on one side of the cathode layer away from the base substrate.

Figure 11:
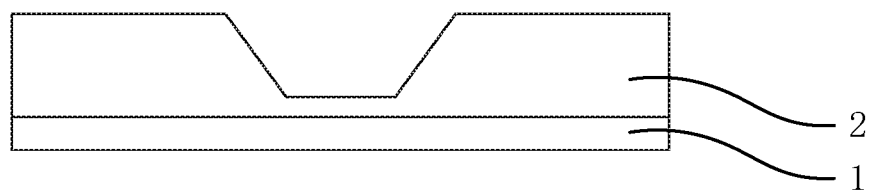
FIGS. 11 to 15 are structural schematic diagrams corresponding to respective steps in a method for preparing a top emission-type display panel.
Figure 12:
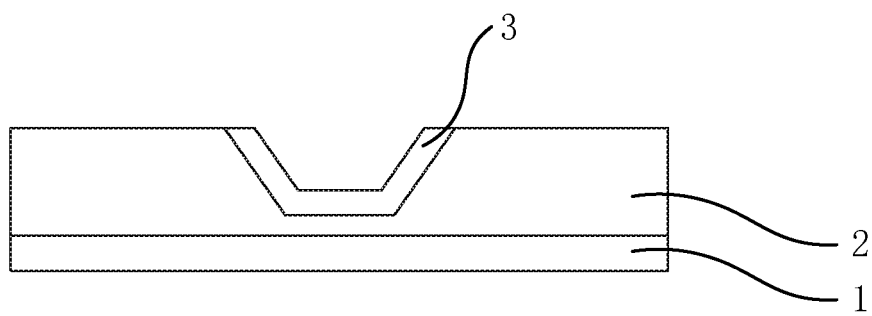
Figure 13:
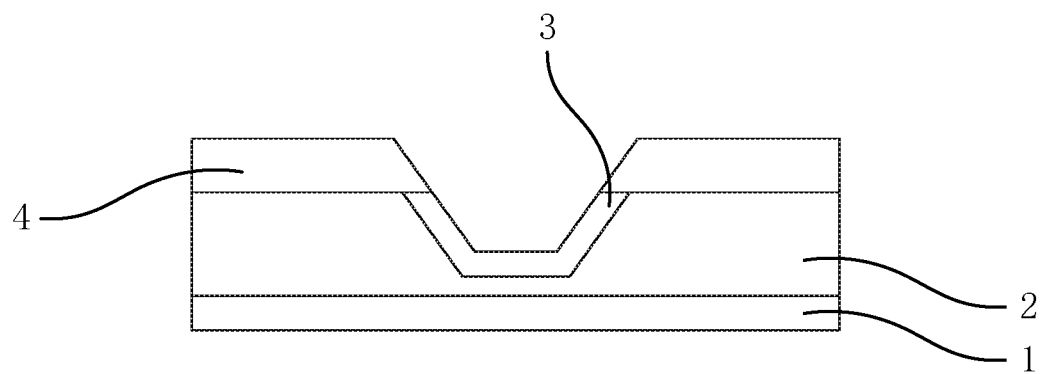
Figure 14:
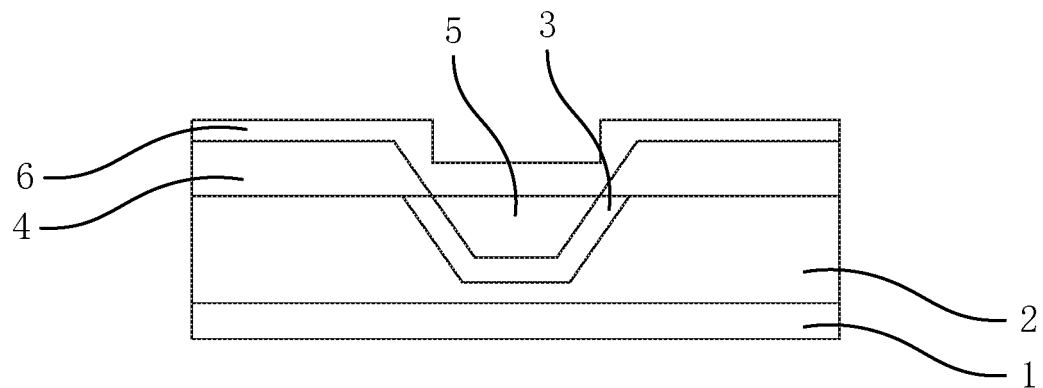
Figure 15:
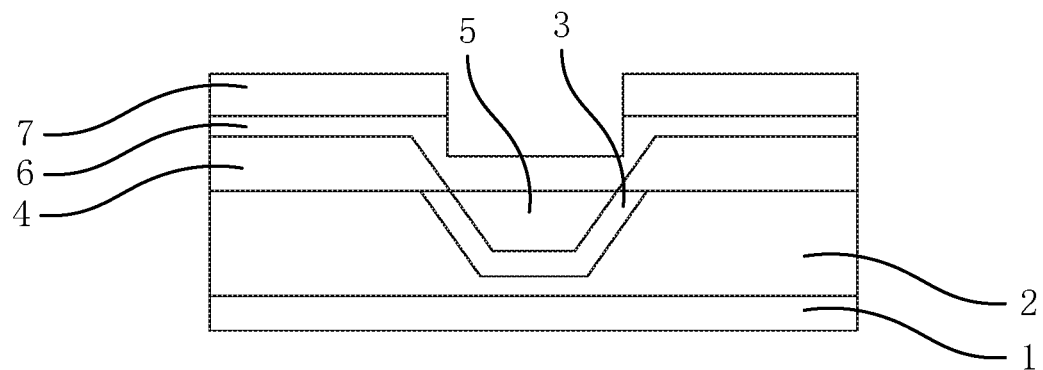

For the top emission-type display panel shown in FIG. 4, the anode layer needs to be made into a reflective cup structure before the auxiliary cathode layer is formed. Optionally, as shown in FIG. 11, after the buffer layer 2 is formed on the base substrate 1, the etching process is used to form a recess at the opening area. Then, as shown in FIG. 12, a pattern of the anode 3 is formed in the recess, so that the anode 3 forms the reflective cup structure, and one side of the anode 3 close to the base substrate 1 has the reflective layer with a certain light transmittance. Then, as shown in FIG. 13, the pixel defining layer 4 is formed on the film layer where the anode 3 is located, and the pixel defining layer 4 is etched to expose the anode 3 at the opening area. As shown in FIG. 14, the light-emitting layer 5 is formed in the opening area and the cathode layer 6 is formed on the light-emitting layer. A part of the cathode layer 6 at the opening area is embedded in an opening of the pixel defining layer 4. Then, the auxiliary cathode layer 7 is formed by using the above evaporation process to obtain the structure shown in FIG. 15.

For the top emission-type display panel, the light emitted from the light-emitting layer 5 is emergent from one side of the auxiliary cathode layer 7 through the opening area. For the external ambient light incident from one side of the auxiliary cathode layer 7, one part is incident into the inner side of the display panel through the opening area and emergent from one side of the base substrate 1, and the other part is reflected by the auxiliary cathode layer 7 at the non-opening area. The non-opening area is a double-layer electrode including the cathode 6 and the un-etched auxiliary cathode layer 7, the thickness is larger, and the reflectivity is high, thereby improving the contrast of mirror plane display.

Obviously, those skilled in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure also intends to comprise these modifications and variations.

What is claimed is:

1. A display panel, comprising:
   a base substrate;
   a pixel defining layer, disposed on one side of the base substrate, wherein the pixel defining layer comprises a plurality of openings distributed in an array;
   a cathode layer, disposed on one side of the pixel defining layer away from the base substrate; and
   an auxiliary cathode layer, disposed on one side of the cathode layer away from the pixel defining layer,
   wherein:
      the auxiliary cathode layer is directly in contact with and electrically connected to the cathode layer, and
      the auxiliary cathode layer has a first thickness at positions corresponding to the plurality of openings, and a second thickness at positions other than the plurality of openings; and the first thickness is less than the second thickness, the display panel is configured to display an image at the positions corresponding to the plurality of openings and reflect an image at the positions other than the plurality of openings.

2. The display panel of claim 1, further comprising:
   a plurality of filling structures located between the auxiliary cathode layer and the cathode layer and corresponding to the openings,
   wherein:
      the cathode layer is a reflective electrode;
      the first thickness of the auxiliary cathode layer is greater than 0;
      the auxiliary cathode layer has, at one side facing the cathode layer, a plurality of grooves corresponding to the respective openings; and
      at least part of the filling structures are embedded in corresponding grooves.

3. The display panel of claim 2, wherein along a direction in which the base substrate is directed to the cathode layer, a cross-sectional area of the groove, in a direction parallel to the base substrate, gradually decreases.

4. The display panel of claim 2, wherein the auxiliary cathode layer has, on one side away from the cathode layer, a plurality of protrusions at positions corresponding to the openings.

5. The display panel of claim 1, further comprising:
   a plurality of anodes located between the pixel defining layer and the base substrate, wherein:
      the anode comprises a reflective electrode; and
      the first thickness of the auxiliary cathode layer is equal to 0.

6. The display panel of claim 5, wherein the anode comprises:
   two transparent electrodes disposed in a laminating manner, and
   the reflective electrode located between the two transparent electrodes.

7. The display panel of claim 6, further comprising:
   a buffer layer disposed between the base substrate and the anodes,
   wherein:
      the buffer layer has, at one side facing the pixel defining layer, a plurality of recesses,
      wherein:
         positions of the plurality of recesses correspond to positions of respective openings; and
         positions of the plurality of anodes correspond to the positions of the respective recesses, and at least part of the anodes are embedded in corresponding recesses; and
         along a direction in which the base substrate is directed to the cathode layer, a cross-sectional area of the recess, in a direction parallel to the base substrate, gradually increases.

8. The display panel of claim 7, wherein
   a material of the transparent electrode is indium tin oxide, and
   a material of the reflective layer is silver.

9. The display panel of claim 1, wherein the cathode layer is embedded in the openings at the positions corresponding to the openings.

10. The display panel of claim 1, further comprising:
    a light-emitting layer disposed between the cathode layer and the base substrate, wherein
       the light-emitting layer comprises a plurality of light-emitting units corresponding to the respective openings; and
       a surface of one side of each light-emitting unit away from the base substrate is closer to the base substrate than a surface of one side of the pixel defining layer away from the base substrate.

11. The display panel of claim 1, wherein a material of the cathode layer is a magnesium-silver alloy.

12. The display panel of claim 1, wherein a material of the auxiliary cathode layer is silver or aluminum.

13. A display device, comprising the display panel of claim 1, wherein the display panel comprises:
    a base substrate;
    a pixel defining layer, disposed on one side of the base substrate, wherein the pixel defining layer comprises a plurality of openings distributed in an array;
    a cathode layer, disposed on one side of the pixel defining layer away from the base substrate; and
    an auxiliary cathode layer, disposed on one side of the cathode layer away from the pixel defining layer,
    wherein:
       the auxiliary cathode layer is directly in contact with and electrically connected to the cathode layer, and
       the auxiliary cathode layer has a first thickness at positions corresponding to the plurality of openings, and a second thickness at positions other than the plurality of openings; and the first thickness is less than the second thickness, the display panel is configured to display an image at the positions corresponding to the plurality of openings and reflect an image at the positions other than the plurality of openings.

14. A vehicle-mounted rearview mirror, comprising the display panel of claim 1.

15. A method for preparing the display panel of claim 1, comprising:
    forming a pixel defining layer on a base substrate;
    patterning the pixel defining layer to form a plurality of openings distributed in an array;
    forming a cathode layer on one side of the pixel defining layer away from the base substrate; and
    forming an auxiliary cathode layer on one side of the cathode layer away from the pixel defining layer, wherein:
        the auxiliary cathode layer has a first thickness at positions corresponding to the plurality of openings, and
        a second thickness at positions other than the plurality of openings; and the first thickness is less than the second thickness.

16. The preparing method of claim 15, wherein
    a display surface of the display panel is arranged on one side of the base substrate away from the pixel defining layer; and
    forming the auxiliary cathode layer on one side of the cathode layer away from the pixel defining layer comprises:
        thinning the auxiliary cathode layer at the positions corresponding to the openings by adopting an etching process.

17. The preparing method of claim 15, wherein
    a display surface of the display panel is arranged on one side of the base substrate facing the pixel defining layer; and
    forming the auxiliary cathode layer on one side of the cathode layer away from the pixel defining layer comprises:
        adopting a mask to cover areas corresponding to the openings, evaporating the auxiliary cathode layer at one side of the cathode layer away from the pixel defining layer, and
        removing the mask after the evaporating.

* * * * *